(12) United States Patent
Hirata

(10) Patent No.: US 6,670,679 B2
(45) Date of Patent: Dec. 30, 2003

(54) SEMICONDUCTOR DEVICE HAVING AN ESD PROTECTIVE CIRCUIT

(75) Inventor: Morihisa Hirata, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 10/178,657

(22) Filed: Jun. 24, 2002

(65) Prior Publication Data

US 2002/0195648 A1 Dec. 26, 2002

(30) Foreign Application Priority Data

Jun. 25, 2001 (JP) ........................................ 2001-191651

(51) Int. Cl.[7] ............................................... H01L 23/62
(52) U.S. Cl. ........................................ 257/360; 257/316
(58) Field of Search .................... 27/360, 316, 368, 27/379, 412, 413

(56) References Cited

U.S. PATENT DOCUMENTS

| | | | |
|---|---|---|---|
| 5,142,345 A | * | 8/1992 | Miyata |
| 5,272,586 A | * | 12/1993 | Yen ............................. 361/111 |
| 5,932,918 A | | 8/1999 | Krakauer ..................... 257/368 |
| 5,982,600 A | | 11/1999 | Cheng ......................... 361/111 |
| 6,008,508 A | | 12/1999 | Bergemont et al. ......... 257/175 |
| 6,147,538 A | | 11/2000 | Andresen et al. ........... 327/309 |

FOREIGN PATENT DOCUMENTS

JP         63-202056         8/1988         ........... H01L/27/08

OTHER PUBLICATIONS

Krieger and Niles; *Diffused Resistors Characterised at High Current Density Levels–Analysis and Applications* (IEEE Transactions on Electron Devises, vol. 36 No. 2 pp. 416–423, Feb. 1989).

Ker et al; *Dynamic–Floating–Gate Design for Output ESD Protection in a 0.35 um CMOS Cell Library* (Proceedings of the 1998 IEEE International Symposium on Circuits and Systems, vol. 2 Pates 216–219).

* cited by examiner

*Primary Examiner*—Mark V. Prenty
(74) *Attorney, Agent, or Firm*—Hayes Soloway P.C.

(57) ABSTRACT

A protective circuit includes a floating gate MOSFET having a source-drain path connected between an I/O line and a source line or a ground line, a control gate connected to the I/O line and a floating gate connected to the source line or the ground line.

19 Claims, 13 Drawing Sheets

SEMICONDUCTOR DEVICE HAVING AN ESD PROTECTIVE CIRCUIT

BACKGROUND OF THE INVENTION (a) Field of the Invention

The present invention relates of a semiconductor device having an ESD (electrostatic-discharge) protective circuit and, more particularly, to a semiconductor device having an ESD protective circuit for protecting the internal circuit of the semiconductor device against the ESD breakdown.

(b) Description of the Related Art

A semiconductor integrated circuit (or semiconductor device) fabricated on a semiconductor substrate generally includes semiconductor elements such as MOSFETs. It is known that MOSFETs are liable to ESD breakdown wherein an excessively high input voltage such as an electrostatic pulse voltage enters and damages the semiconductor device. Thus, a technique for protecting the semiconductor elements in the semiconductor device against the damage caused by and ESD breakdown is essential to the semiconductor device. A large number of proposals have been made and used heretofore for the technique.

Along with the higher integration of the semiconductor device as well as developments for lower operational voltage and lower power dissipation thereof, the semiconductor elements constituting the semiconductor device have more and more smaller dimensions and thereby increase in number per unit area. This leads to increase in the probability of the ESD breakdown of the semiconductor elements, especially of the MOSFETs, having smaller dimensions and packed with a higher density.

In the semiconductor device including semiconductor elements having smaller dimensions the operational voltage of the peripheral circuit is generally higher than the operational voltage of the internal circuit. For example, the peripheral circuit operates on a 5-volt power source whereas the internal circuit operates on a 2-volt power source. Accordingly, the gate insulation films of the MOSFETs have a larger thickness in the peripheral circuit than in the internal circuit.

In addition, a system-on-chip configuration having a combination of memory, logic and analog circuits is more and more employed in the semiconductor devices. Among others, the combination device having a flash memory or nonvolatile memory and a logic circuit includes a larger number of floating gate MOSFETs. The floating gate MOSFETs are not used in a semiconductor device having no non-volatile memory heretofore.

A conventional ESD protective circuit for protecting a semiconductor device is described in JP-A-63-202056. FIG 1A shows the described ESD protective circuit and FIG. 1B shows a schematic sectional view thereof.

In FIG. 1A, an input 72 is connected to an input terminal 71 at one end, and also is connected at the other end to a gate of a MOSFET in an internal circuit not shown. An ESD protective nMOSFET 73 is connected between the input line 72 and the ground line VSS, the nMOSFET 73 having a gate maintained at the ground potential (VSS potential).

The nMOSFET 73 as described above has large dimensions in general. Although the ESD protective device includes the single nMOSFET 73 therein, the nMOSFET 73 acts as a bipolar transistor upon input of a high-voltage pulse. Thus, in FIG. 1A, a parasitic bipolar transistor 74 is depicted between the input line 72 and the ground line.

In FIG. 1B, the protective nMOSFET 73 is formed on a p-type semiconductor substrate 75, wherein an $n^+$-diffused region 76 constituting a drain and connected to the input terminal 71 is surrounded by an overlying gate electrode 77, which is surrounded by another $n^+$-diffused region 78 constituting a source.

The parasitic NPN bipolar transistor 74 depicted by dotted lines includes a base at the semiconductor substrate 75, an emitter at the source 78 of the nMOSFET 73 and a collector at the drain 76 of the nMOSFET 73. It is to be noted that the source 78 is connected to the ground line VSS, and the input terminal 71 implemented by a metallic pad is formed on the drain 76.

In the conventional semiconductor device of FIGS. 1A and 1B, if an excessively high input voltage is applied to the drain 76 through the input lien 71, an avalanche breakdown first occurs at the p-n junction formed just under the gate electrode 77 between the semiconductor substrate 75 and the drain 76. The avalanche breakdown generates a large number of positive holes as majority carriers. The positive holes thus generated raises the potential of the semiconductor substrate 15 to a positive side, which allows the parasitic bipolar transistor to operate in a snapback mode. The snapback mode of the parasitic bipolar transistor turns ON the nMOSFET, which discharges and lowers the potential of the drain 76 caused by the excessively high input voltage.

The avalanche breakdown of the p-n junction is generally local in the nMOSFET having larger dimensions. In this case, the bipolar mode caused by the avalanche breakdown remains in the limited area of the nMOSFET here the breakdown first occurred. Thus, the local area at which the avalanche breakdown first occurred is likely to be damaged by the ESD breakdown. The locality of the bipolar mode of the nMOSFET is enhanced by an LDD structure of the diffused regions, whereby the local breakdown is more likely in the MOSFET having the LDD structure.

In addition, the nMOSFET is liable to damages by a breakdown in the gate insulation film thereof. The breakdown in the gate insulation film occurs more frequently in the case of a MOSFET having smaller dimensions. The breakdown in the gate insulation film is considered due to the potential rise of the semiconductor substrate caused by the avalanche breakdown generating a large number of positive holes. The positive holes entering the gate insulation film 17 from the semiconductor substrate 15 more raises the potential of the gate insulation film compared to the semiconductor substrate 15.

FIG. 2 shows another conventional ESD protective circuit, wherein an input line 82 is connected to an input terminal 81 and also connected to a gate of MOSFET in an internal circuit not shown. The protective circuit includes a pMOSFET 83 connected between the high-voltage power source line (VCC line) and the input line 82, and an nMOSFET 84 connected between the input line 82 and the ground line VSS. The pMOSFET 83 has a gate and a backgate (or well) both connected to the VCC line. The nMOSFET 84 has a gate and a backgate (or well) both connected to the ground line VSS.

If an excessively high input voltage having a positive polarity is applied to the input terminal 81, positive holes are generated due to the avalanche breakdown of the p-n junction formed on the drain of the nMOSFET 84. The positive holes raises the potential of the semiconductor substrate thereby allow the nMOSFET 84 to operate in a bipolar mode and cause a snapback breakdown. Similarly, if an excessively high voltage having a negative polarity is applied to the input terminal 81, electrons are generated due to the avalanche breakdown of the p-n junction formed on the drain of the pMOSFET 83. The electrons lower the potential of the semiconductor substrate, thereby allowing the pMOSFET to operate in a bipolar mode and cause a snapback breakdown. It is to be noted that the p-n junction on the drain is forward-biased if either the excessively high voltage as described above is applied to the input terminal 81. The ESD occurs through the p-n junction constituting a diode.

In the conventional protective circuit of FIG. 2, if a high input voltage which does not cause the avalanche breakdown is applied to the input terminal, the protective circuit cannot respond to the high input voltage. Since the avalanche breakdown voltage cannot be adjusted to a satisfactory lower level, it is difficult to obtain a protective circuit of FIG. 2 having a desired operational voltage. In contrast, it is possible to obtain a protective circuit of FIG. 1A having a desired operational voltage because a smaller gate length and a smaller thickness of the gate insulating film allow the MOSFET to respond to a lower pulse voltage and generate an ESD.

In the current semiconductor devices, the withstand voltage of the p-n junction has a tendency to exceed the expected voltage defined by the scaling low of the finer pattern of the MOSFETs. In addition, in the nonvolatile memory such as a flash EEPROM, the programming/erasing voltage is considerably higher than the power source voltage. Accordingly, a breakdown of the gate insulation film often occurs before the avalanche breakdown of the p-n junction.

As a common problem in the protective circuits of FIGS. 1A and 2, the MOSFETs provided in the protective circuits have larger dimensions compared to the other MOSFETs in the internal circuit. For example, the MOSFET in the protective circuit has a gate length (L) of 1 $\mu$m, and a gate width (W) of 500 $\mu$m. For this purpose, the MOSFET in the protective circuit includes ten unit MOSFETs in parallel each having a gate electrode having a gate width of 50 $\mu$m, for example. In this configuration, the local avalanche breakdown has a tendency to activate a specific unit MOSFET among the ten unit MOSFETs, whereby the breakdown current concentrated at the single unit MOSFET damages the same and thus the protective circuit itself.

FIG. 3 shows another conventional protective circuit, wherein an nMOSFET 93 is connected between the input line 92 and the ground line VSS, the nMOSFET 93 having a gate electrode connected to the I/O line 92 via a capacitor 94 and to the ground line VSS via a resistor 95.

In the protective circuit of FIG. 6, if an electrostatic high-voltage pulse is applied to the I/O line 92, the gate potential of the nMOSFET 93 is momentarily raised via the capacitor 94, whereby the nMOSFET 93 is turned ON to effect electrostatic discharge (or ESD). By setting the resistance of the resistor 95 at a suitable value, the operation voltage of the nMOSFET 93 can be adjusted.

The protective circuit of FIG. 3 is more effective for controlling the operational voltage compared to the protective circuits of FIGS. 1A and 2 wherein the avalanche breakdown voltage of the p-n junction is difficult to control. However, the protective circuit of FIG. 3 has a drawback wherein this type of nMOSFET cannot be used as an output buffer.

SUMMARY OF THE INVENTION

In view of the above problems in the conventional techniques, it is an object of the present invention to provide a semiconductor device having an ESD protective circuit which is capable of protecting the internal circuit of the semiconductor device against an ESD breakdown, with a limited area for the protective circuit and a simplified structure.

The present invention provides a semiconductor device including a semiconductor substrate, and internal circuit formed on the semiconductor substrate, and a protective circuit for protecting the internal circuit against an electrostatic discharge breakdown, the protective circuit including at least one first floating gate MOSFET, the first floating gate MOSFET having a source-drain path connected between an input/output line (I/O line) and a constant potential line, a control gate connected to the I/O line, a floating gate connected to the constant potential line or a first line.

The present invention also provides a semiconductor device including a semiconductor substrate, an internal circuit formed on the semiconductor substrate and a protective circuit for protecting the internal circuit against an electrostatic discharge breakdown, the protective circuit including at least one first floating gate MOSFET, the first floating gate MOSFET having a source-drain path connected between a first I/O line and a second I/O line, a control gate connected to the first I/O line, a floating gate connected to a ground line.

In accordance with the semiconductor device of the present invention, the floating gate MOSFET first operates in a pinch-off mode due to the potential rise of the control gate receiving an excessively high input voltage, thereby generating positive holes in the semiconductor substrate. The positive holes thus generated trigger the floating gate MOSFET to operate in a uniform bipolar mode due to the presence of a parasitic bipolar transistor in the floating gate MOSFET. The uniform bipolar mode operation of the floating gate MOSFET allows a uniform snapback breakdown thereof, whereby the protective circuit can protect the internal circuit against the excessively high input voltage which may have a relatively lower voltage compared to a clock signal, for example, without causing a damage of the protective device itself.

The above and other objects, features and advantages of the present invention will be more apparent from the following description, referring to the accompanying drawings.

PREFERRED EMBODIMENTS OF THE INVENTION

Figure 4:
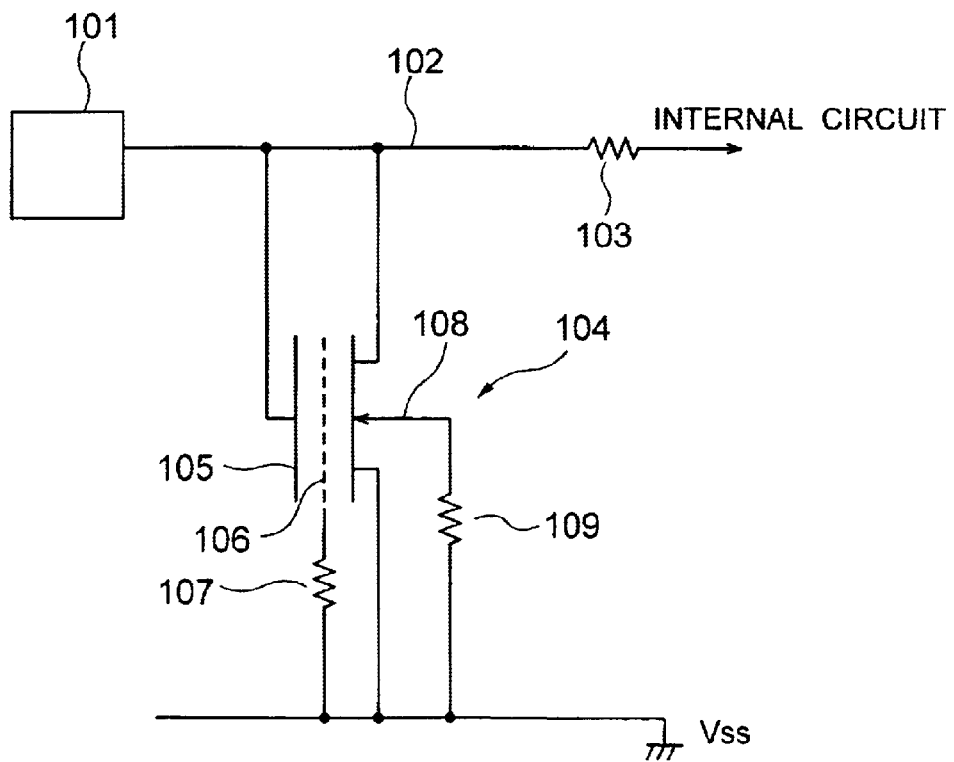
FIG. 4 is an equivalent circuit diagram of an ESD protective circuit according to a first embodiment of the present invention.

Now, the present invention is more specifically described with reference to accompanying drawings. Referring to FIG. 4, an ESD protective circuit (simply referred to as protective circuit hereinafter) according to a first embodiment of the present invention includes a floating gate nMOSFET 104 connected between an input/output line (I/O line) 102 connected to an input/output terminal (I/O terminal) 101 and ground line VSS. The I/O line 102 is connected to a gate of a MOSFET in an internal circuit via a protective resistor 103.

The nMOSFET 104 includes a control gate 105 connected to the I/O line 102, a floating gate 106 connected to the ground line VSS via a floating gate resistor 107, and a backgate 108 connected to the ground line VSS via a backgate resistor 109.

Figure 5:
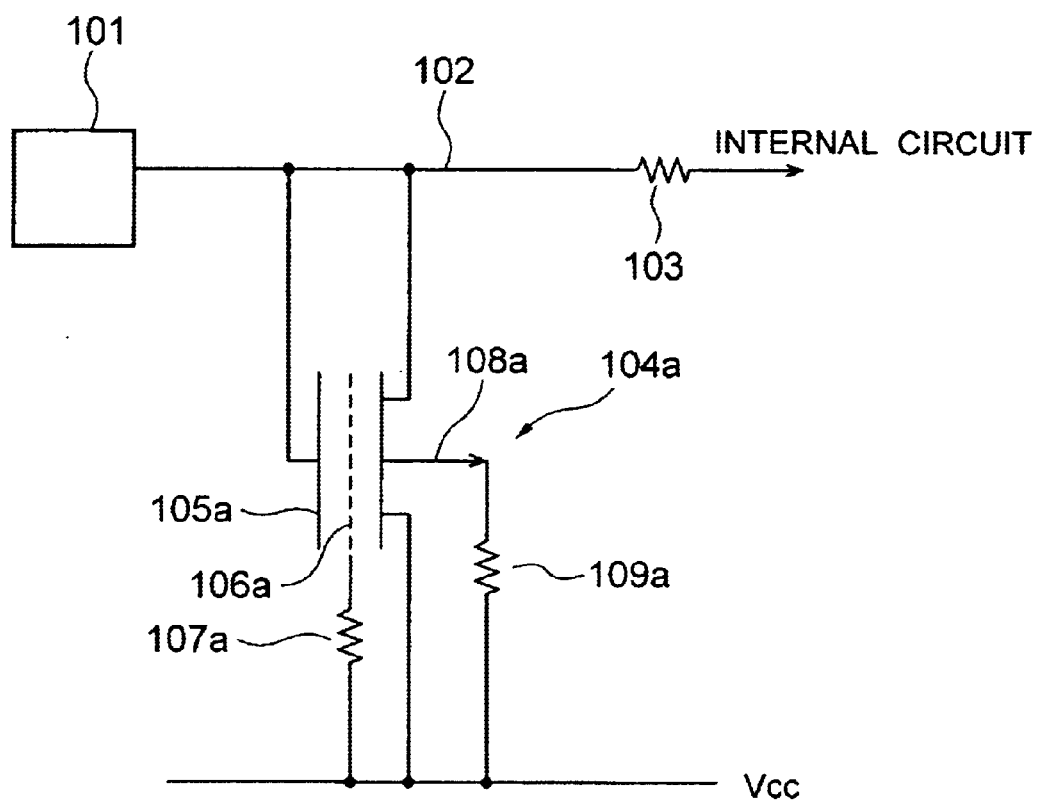
FIG. 5 is an equivalent circuit diagram of another ESD protective circuit according to the first embodiment of the present invention.

Referring to FIG. 5, another protective circuit according to the first embodiment is similar to the protective circuit of FIG. 4, except that a floating gate pMOSFET 104a is connected between the I/O line 102 and the ground line VSS instead of the nMOSFET 104 in FIG. 4. The floating gate pMOSFET 104a includes a control gate 105a connected to the I/O line 102, a floating gate 106a connected to the constant potential line Vcc via a floating gate resistor 107a, and a backgate 108a connected to the constant potential line Vcc via a backgate resistor 109a.

Figure 6:
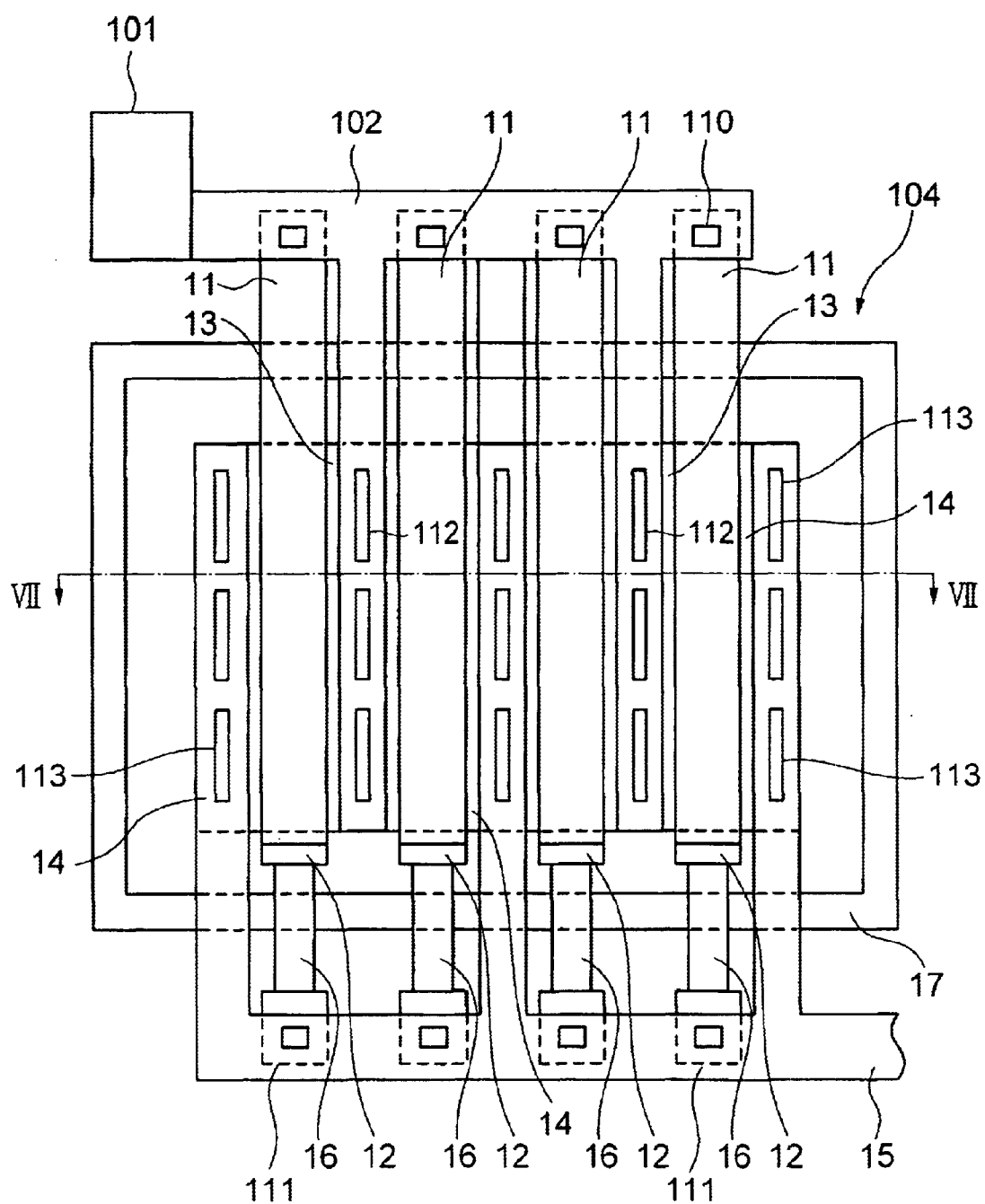
FIG. 6 is a top plan vie of the ESD protective circuit of FIG. 4.

Referring to FIG. 6 showing the structure of the protective circuit of FIG. 4, the I/O line 102 extends from the I/O terminal 101, and is connected to a plurality of separate fingers 11 of the control gate electrode 105 of the floating gate nMOSFET 104 via through-holes 110. A plurality of separate fingers 12 of the floating gate electrode 106 underlie the respective fingers 11 of the control gate electrode 105, with an intervention of an insulation film therebetween. The I/O line 102 is also connected to drain diffused regions 13 via a plurality of branch lines and plurality of through-holes 112.

The floating gate nMOSFET 104 includes a plurality of source diffused regions 14 each opposing a corresponding drain diffused region 13, with the fingers 11 and 12 of the control and floating gate electrodes disposed therebetween. The source diffused regions 14 are connected to branch lines of the ground line VSS 15 via through-holes 113. Each finger 11 of the floating gate electrode 12 is connected to the ground line VSS 15 via a resist layer 16 and a through-hole 111. An annular diffused region 17 surrounds the source and drain diffused regions 13 and 14.

The finger 12 of the floating gate electrode 106 is made of polysilicon doped with impurity ions at a concentration of $10^{18}$ to $10^{20}$ atoms/cm$^3$. The resist layer 16 is made of polysilicon doped with impurity ions at a concentration of $\frac{1}{10}$ of the impurity concentration of the finger 12 of the floating gate electrode 106. The resist layers 16 constitute the floating gate resistor 107.

Figure 7:
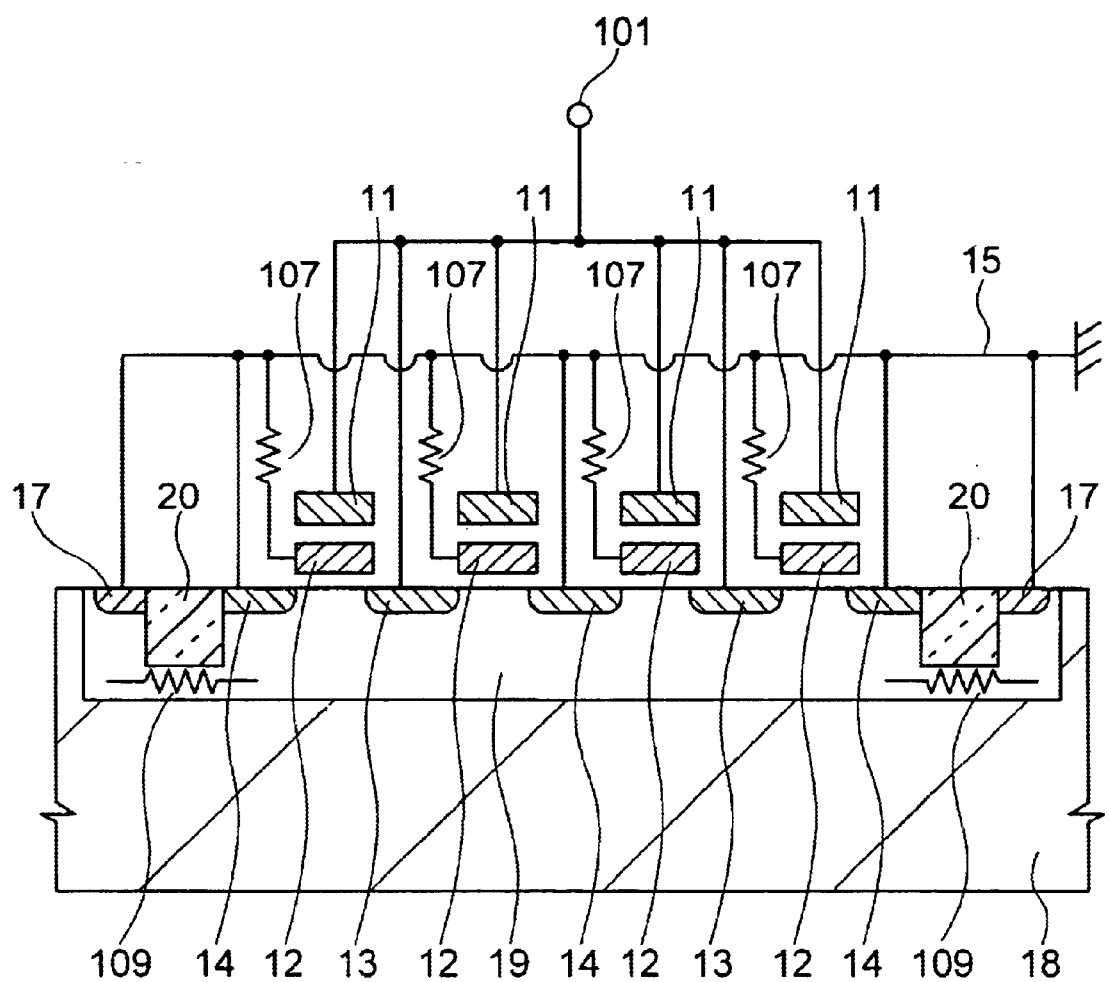
FIG. 7 is a sectional view of the ESD protective circuit of FIG. 4, taken long line VII—VII in FIG. 6.

Referring to FIG. 7, the nMOSFET has source and drain diffused regions 14 and 13 formed in a p-well 19, which is formed on the surface area of a n-type silicon substrate 18, for example. The p-well 19 has an impurity concentration of around $10^{17}$ atoms/cm3. An element isolation (insulation) film 20 is selectively formed on the surface area of the p-well 19. The backgate resistor 19 is formed just under the element isolation film 20 within the p-well 19. The resistance of the backgate resistor 109 is controlled by the thickness of the element isolation film 20.

The source and drain diffused regions 14 and 13 are n-type, whereas the annular diffused region 17 is p-type. Each finger 11 of the floating gate electrode 105 overlies the p-well 19 between the source diffused region 13 and the drain diffused region 14, with an intervention of a tunnel oxide film disposed between the p-well and the floating gate electrode 12. Each finger 11 of the control gate electrode overlies the corresponding finger 12 of the floating gate electrode 106, with an intervention of an insulation layer.

Figure 3:
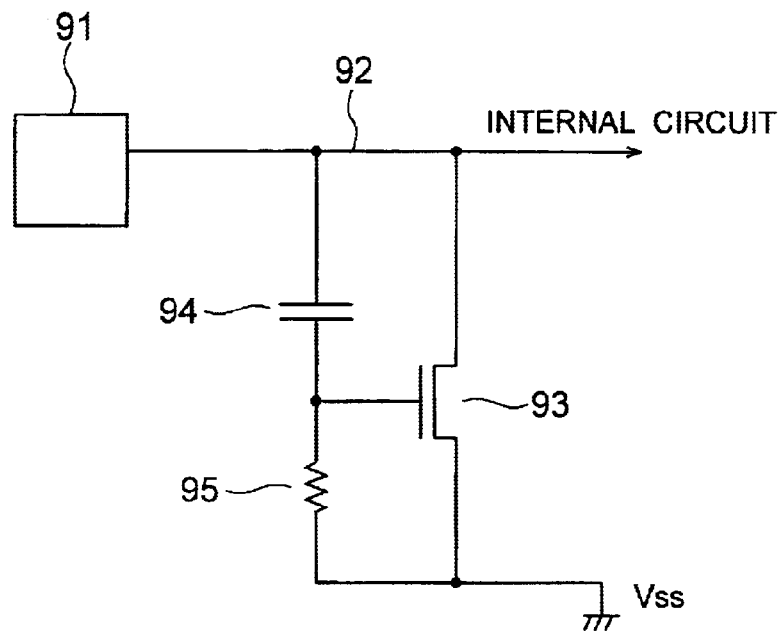
FIG. 3 is an equivalent circuit diagram of another conventional ESD protective circuit.

Although each of the control gate 105 and the floating gate 106 is shown as separated into four fingers 11 and 12 in FIGS. 3 and 4, each of these electrodes 105 and 106 may be preferably separated into ten pieces, for example. In other words, the nMOSFET 104 includes ten unit nMOSFETs in this example. In such a case, the width of the fingers is designed at around 1 $\mu$m, and the length thereof is designed at around 40 $\mu$m.

In operation, if an excessive high input voltage having a positive polarity is applied to the I/O terminal 101 in FIG. 4, the potential of the floating gate 106 momentarily rises due to the capacitive coupling between the floating gate 106 and the control gate 105 connected to the I/O line 102. The peak voltage $\Delta V_{FG}$ and the rise period of the momentary potential rise of the floating gate 106 are determined by the capacitances of the inter-electrode insulation film and the tunnel oxide film as well as the resistance of the floating gate resistor 107.

The potential rise of the floating gate 106 turns ON the floating gate nMOSFET 104 at the initial stage of application, or around 1 to 10 nanoseconds after the application, of the excessively high input voltage, thereby generating positive holes.

The turn-On of the floating gate nMOSFET 104 is caused as follows. In FIG. 4, the drain diffused region 13 is applied with the excessively high input voltage through the I/O line 101, whereby the peak potential $\Delta V_{FG}$ of the floating gate electrode 106 exceeds the threshold voltage of the floating gate nMOSFET 104. Thus, the floating gate nMOSFET 104 enters a pinch-off mode, allowing electrons to flow from the source diffused region 14 toward the drain diffused region 13. These electrons generate positive holes in the vicinity of the drain diffused region 13 due to "impact ionization".

The positive holes generated by the impact ionization raises the potential of the p-well 19. Then, the floating gate nMOSFET 104 operates uniformly in a bipolar mode, and evacuates therethrough the charge of the excessively high input voltage in a main ESD operation of the floating gate nMOSFET 104.

More specifically, the positive holes generated by the impact ionization are accumulated in a large quantity in the p-well 19 acting as a backgate 19. The positive holes thus accumulated diffuse within the p-sell 19 due to thermal diffusion. The diffused positive holes flow out to the silicon substrate, on to the ground line VSS through the source diffused region 14. If the source diffused region 14 has a small area, most of the positive holes recombine with the electrons within the p-well 19 or flow out to the ground line VSS 15 through the annular diffused region 17 having a large area. The backgate 109 having a large resistance suppresses the flow-out of the positive holes through the annular diffused region 17, whereby the floating gate nMOSFET 104 operates in a uniform bipolar mode.

The potential rise of the p-well 19 in the positive polarity due to the positive holes allows the floating gate nMOSFET 104 to operate in a uniform bipolar mode as a lateral NPN transistor, with the source diffused region 14 as an emitter, the drain diffused region 13 as a collector and the p-well 19 itself as a base. The uniform bipolar mode operation of the floating gate nMOSFET 104 can be obtained by a snapback breakdown of the bipolar mode operation before occurring of the avalanche breakdown of the drain diffused region 13.

Figure 8:
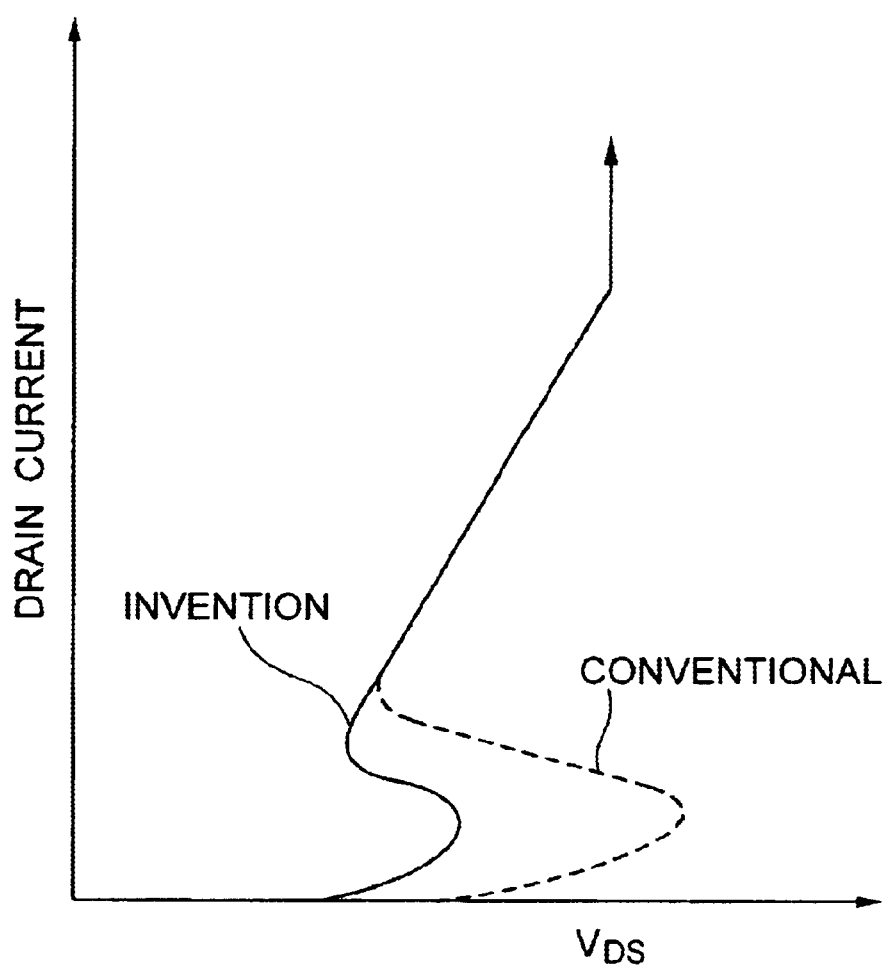
FIG. 8 is a graph of drain current characteristics of the protective circuit according to the first embodiment and the conventional protective circuit.

The above operation is shown by FIG. 8, wherein drain-to-source current $I_D$ is plotted on ordinate against the drain-to-source voltage $V_{DS}$, with the floating gate maintained at the VSS potential. In FIG. 8, the dotted line shows the characteristic curve for the conventional protective circuit, whereas the solid line shows the characteristic curve for the above embodiment. The top arrow depicts a case of the breakdown of the insulation in the floating gate nMOSFET 104. As understood from this figure, the breakdown voltage for the insulation in the present invention is considerably lower than the avalanche breakdown voltage.

In the case of the dotted line wherein the positive holes are not accumulated in the p-well 19 at the initial stage of application of the excessively high input voltage, an avalanche breakdown first occurs, followed by a snapback breakdown due to the positive holes generated by the avalanche breakdown, as described above. In contrast, in the above embodiment, the positive holes generated in the initial stage causes a snapback breakdown without occurring of the avalanche breakdown. This allows all the fingers of the gate electrodes of the floating gate nMOSFET 104 are uniformly activated to operate the nMOSFET 104 in the bipolar mode. In addition, a large number of electrons are injected from the source diffused region 14 to the p-well 19 and flow to the drain diffused region 13, generating positive holes due to impact ionization to raise the potential of the p-well 19 in the positive polarity. In other word, a positive feedback occurs in the present embodiment. Thus, the ESD responding to the excessively high input voltage is effected by the floating gate nMOSFET 104 operating in a NPN bipolar transistor mode.

Figure 1A:
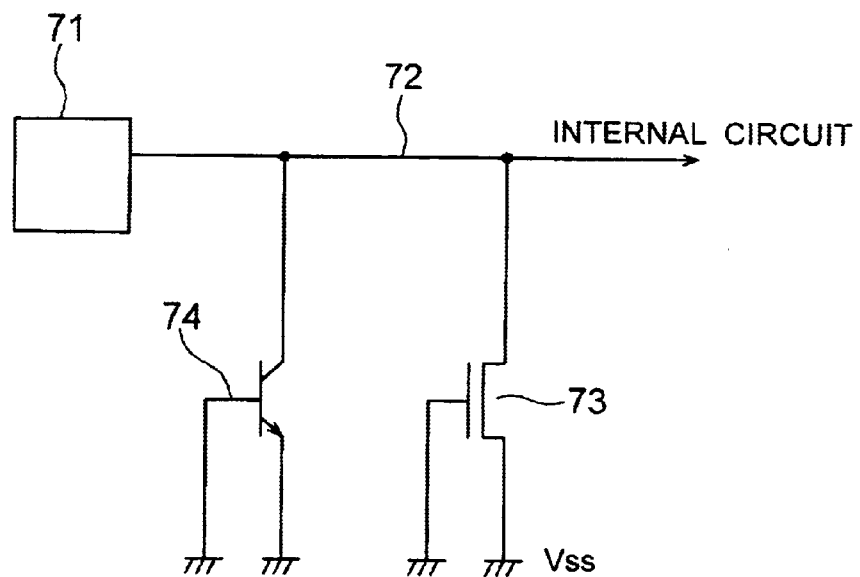
FIG. 1A is an equivalent circuit diagram of a conventional ESD protective circuit.
Figure 1B:
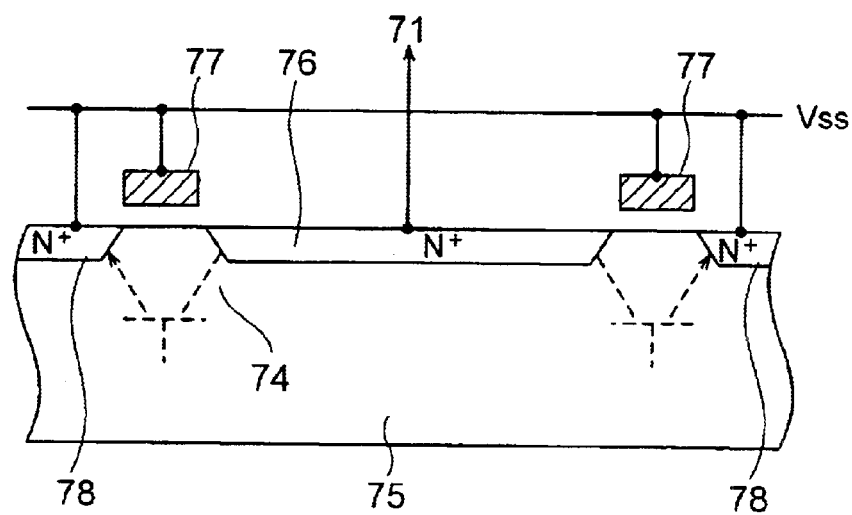
FIG. 1B is a sectional view of the protective circuit of FIG. 1A.

As described before, the floating gate MOSFET 104 in the present embodiment first operates in a pinch-off mode to generate positive holes upon input of an excessively high voltage. The positive holes thus generated allow the floating gate MOSFET 104 to operate in a bipolar mode, with the unit MOSFETs operating uniformly. That is, in accordance with the present invention, the floating agate MOSFET having large dimensions operates uniformly in the bipolar mode differently from the convention protective circuit of FIG. 1A, whereby the local damage of the MOSFET due to the ununiformity of the breakdown can be suppressed.

Figure 2:
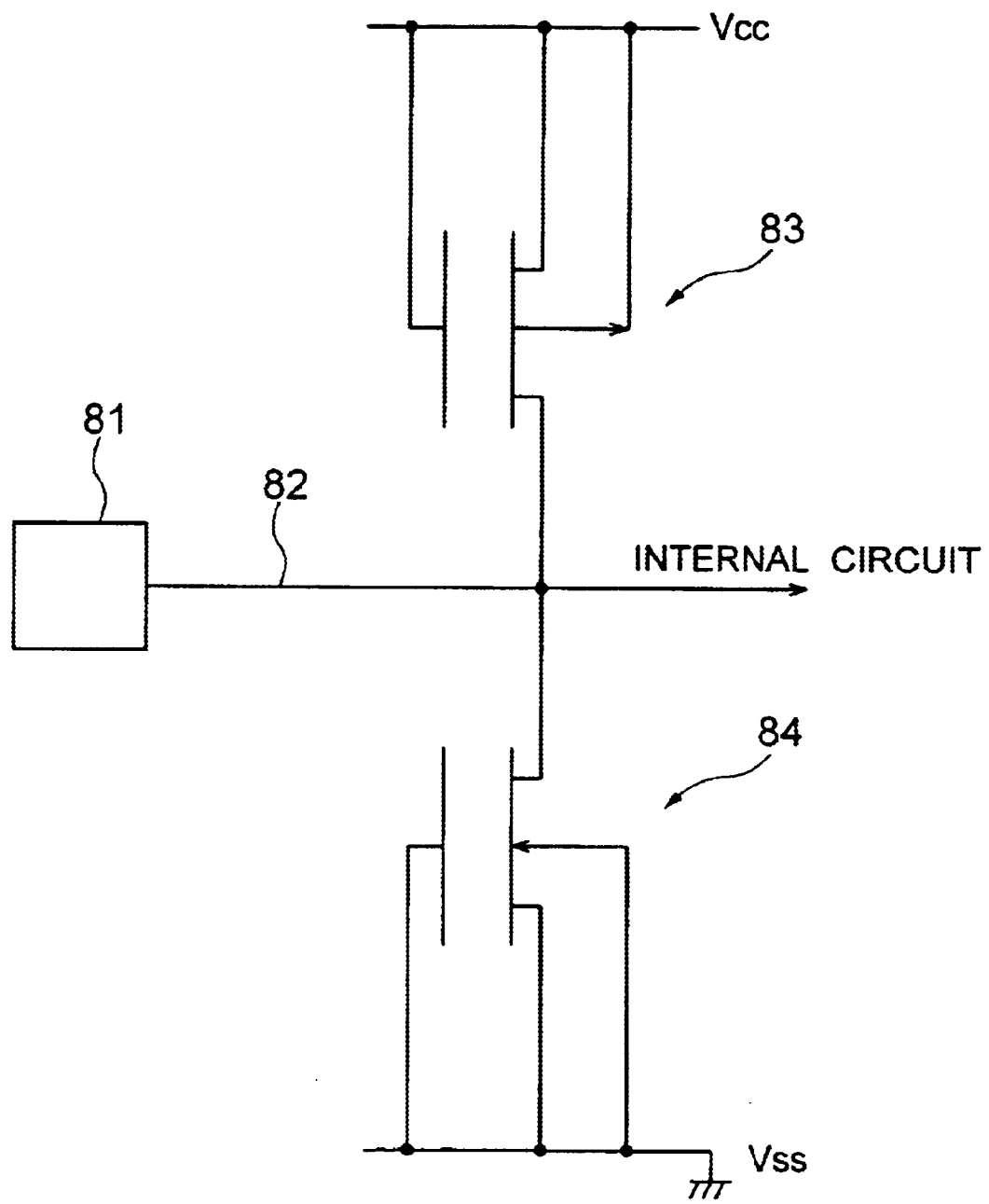
FIG. 2 is an equivalent circuit diagram of another conventional ESD protective circuit.

In addition, the breakdown of the floating gate MOSFET starts at a lower applied voltage compared to the protective circuit of FIG. 2, whereby the operational voltage of the MOSFET can be lower than the breakdown voltage of the gate insulation film of the MOSFETs in the internal circuit. Thus, the protective circuit of the present embodiment protects the internal circuit more safely.

In the above description of operation in the first embodiment, the protective circuit of FIG. 4 is exemplified. The protective circuit of FIG. 5 having a floating gate pMOSFET operates similarly to the protective circuit of FIG. 4 having a floating gate nMOSFET. In this case, electrons operate instead of the positive holes, and the detailed description thereof is omitted here.

Figure 9:
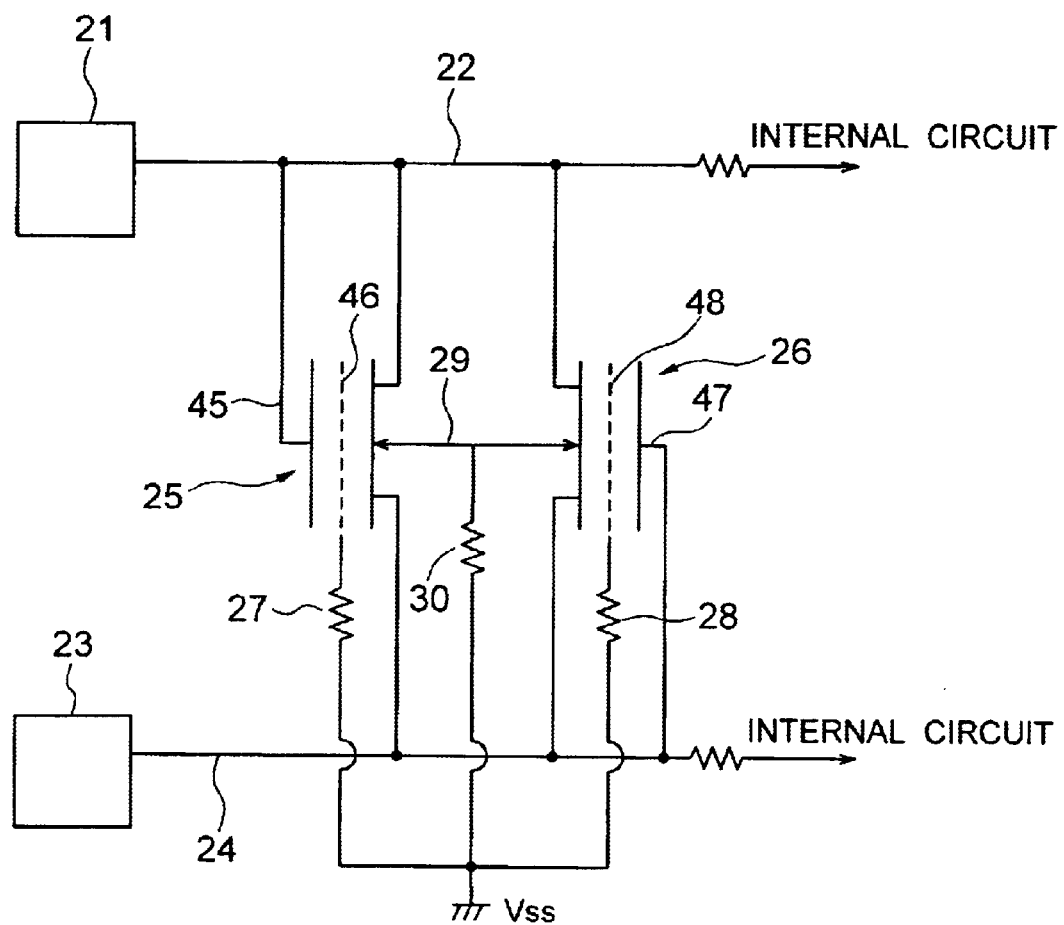
FIG. 9 is an equivalent circuit diagram of an ESD protective circuit according to a second embodiment of the present invention.

Referring to FIG. 9, a protective circuit according to a second embodiment of the present invention is connected between a pair of I/O terminals 21 and 22, which are applied with different source voltages.

In FIG. 9, a first I/O line 22 is connected to the first I/O terminal 21, and connected to the internal circuit via a resistor, whereas a second I/O line 24 is connected to the second I/O terminal, and to the internal circuit via a resistor.

The protective circuit includes a first floating gate nMOSFET 25 and a second floating gate nMOSFET 26, the source/drain paths of which are connected in parallel between the first I/O line 22 and the second I/O line 24. The first floating gate nMOSFET 25 has a control gate 45 connected to the first I/O line 22, and a floating gate 46 connected to the ground line VSS via a floating gate resistor 27. The second floating gate nMOSFET 26 has a control gate 47 connected to the second I/O line 24, and a floating gate 48 connected to the ground line VSS via a floating gate resistor 28. The backgates 29 of both the floating gate nMOSFETs 25 and 26 are connected to the ground line VSS via a backgate resistor 30. The principal operation of the protective circuit of the second embodiment is similar to that of the first embodiment.

Figure 10:
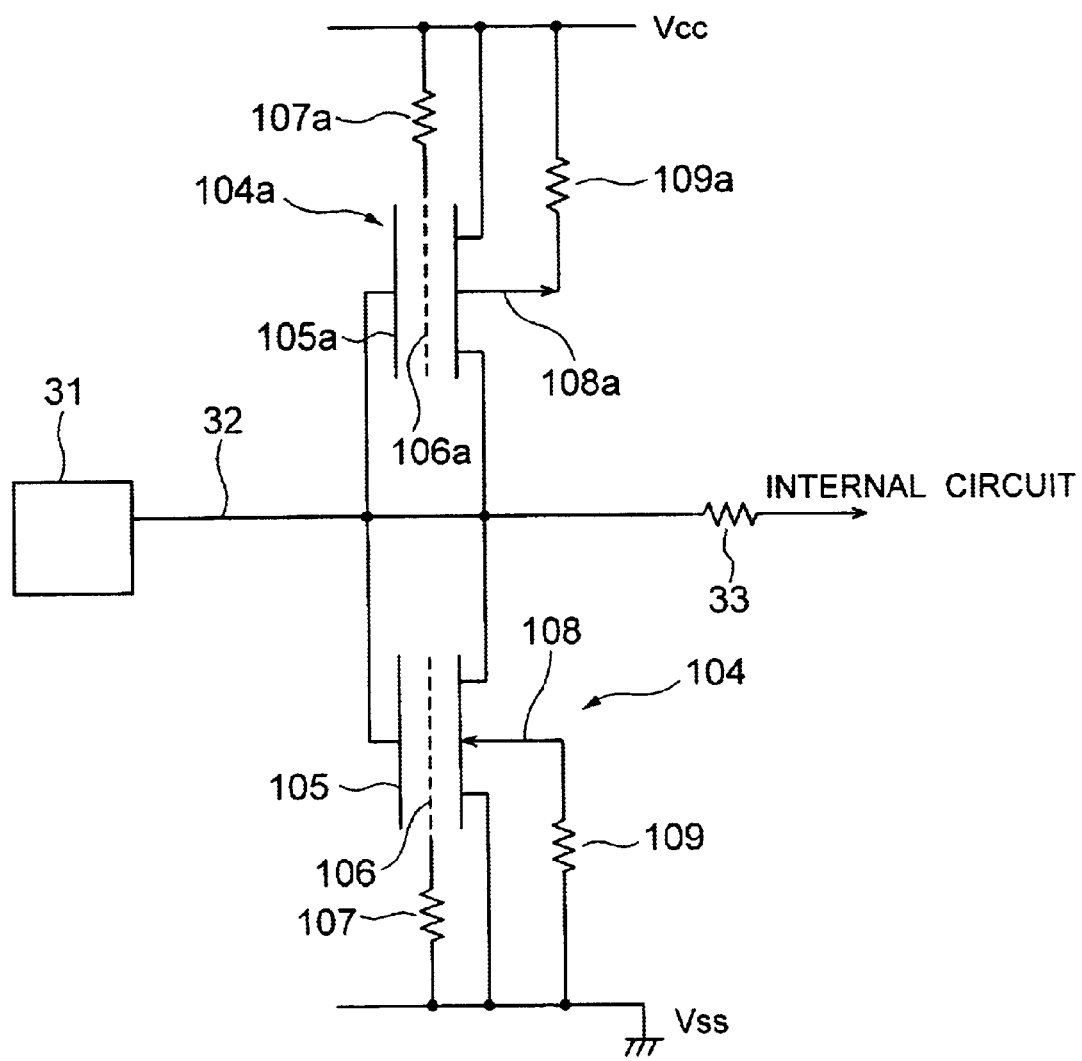
FIG. 10 is an equivalent circuit diagram of an ESD protective circuit according to a third embodiment of the present invention.

Referring to FIG. 10, a protective circuit according to a third embodiment of the present invention includes a floating gate nMOSFET 104 connected between an I/O line 32 and the ground line VSS, and a floating gate pMOSFET 104a connected between the I/O line 32 and the VCC line. This embodiment is a combination of the protective circuit of FIG. 4 and the protective circuit of FIG. 5, and the reference numerals of the constituent elements are similar to those in FIGS. 4 and 5. The operation of the protective circuit of the third embodiment is similar to the first embodiment.

Figure 11:
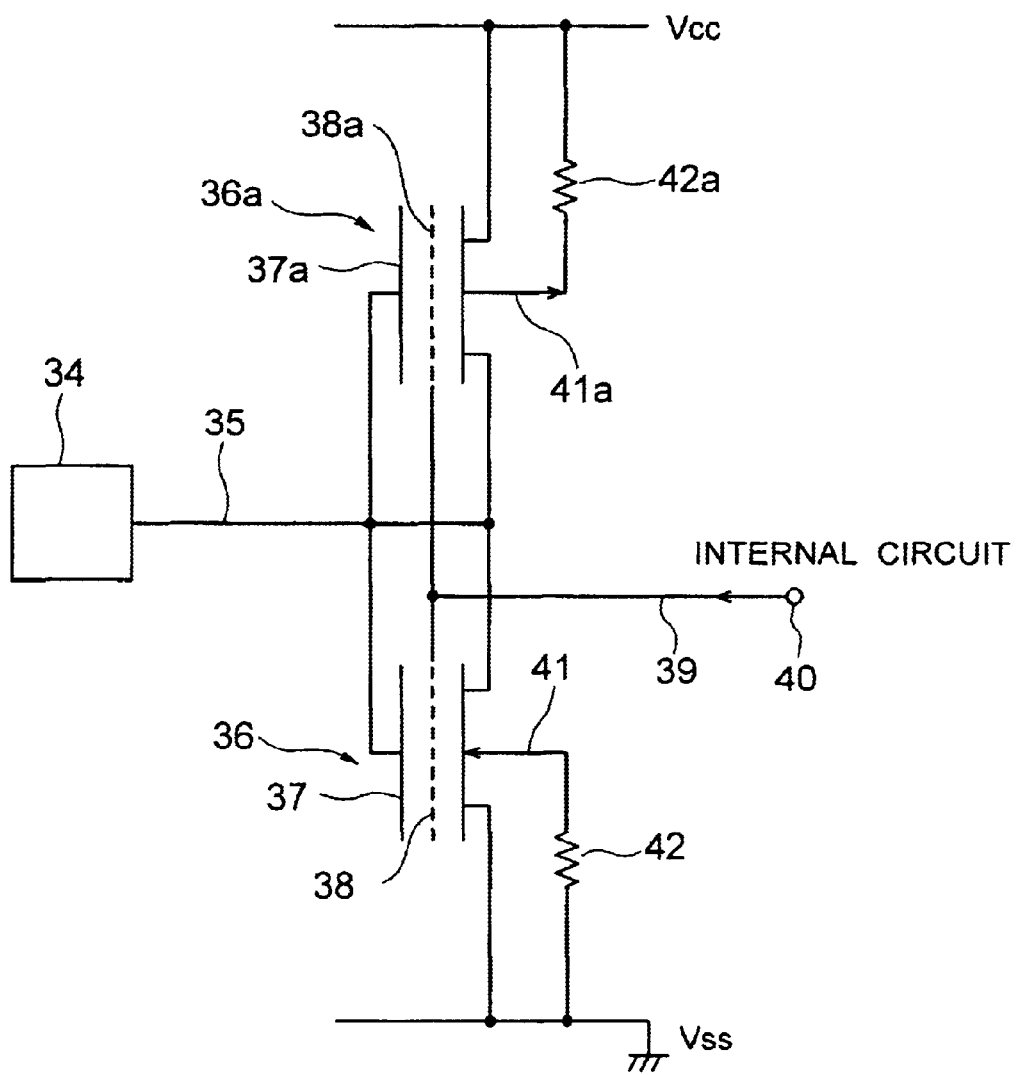
FIG. 11 is an equivalent circuit diagram of an ESD protective circuit according to a fourth embodiment of the present invention.

Referring to FIG. 11, a fourth embodiment of the present invention is such that the present invention is applied to output buffers. More specifically, the protective circuit of the present embodiment includes a floating gate pMOSFET 36a and a floating gate nMOSFET 36 connected in series between the VCC line and the ground line VSS. An output terminal 34 is connected to an output line 35, which is connected to the node connecting the gloating gate pMOSFET 36a and the floating gate nMOSFET 36.

The control gates 37a and 37 of both the floating gate pMOSFET 36a and the floating gate nMOSFET 36 are connected together and also to the output line 35. The floating gates 38a and 38 of both the floating gate pMOSFET 36a and the floating gate nMOSFET 36 are connected together of an output signal line 39 from the internal circuit. The backgate 41a of the floating gate pMOSFET 36a is connected to the VCC line via floating gate resistor 42a, whereas the backgate 41 of the floating gate nMOSFET 36 is connected to the ground line VSS via a floating gate resistor 42.

The protective circuit of the present embodiment operates similarly to the first embodiment. In addition, the floating gate MOSFETs 36 and 36a in the present embodiment operate as output buffers in addition to the ESD protective operation. That is, an output signal delivered through the output signal line 39 is transferred through the floating gate MOSFETs 36 and 36a and through the output terminal 34 to the external circuit. This configuration remarkably reduces the occupied are of the semiconductor device because the output buffer generally has large dimension.

Figure 12A:
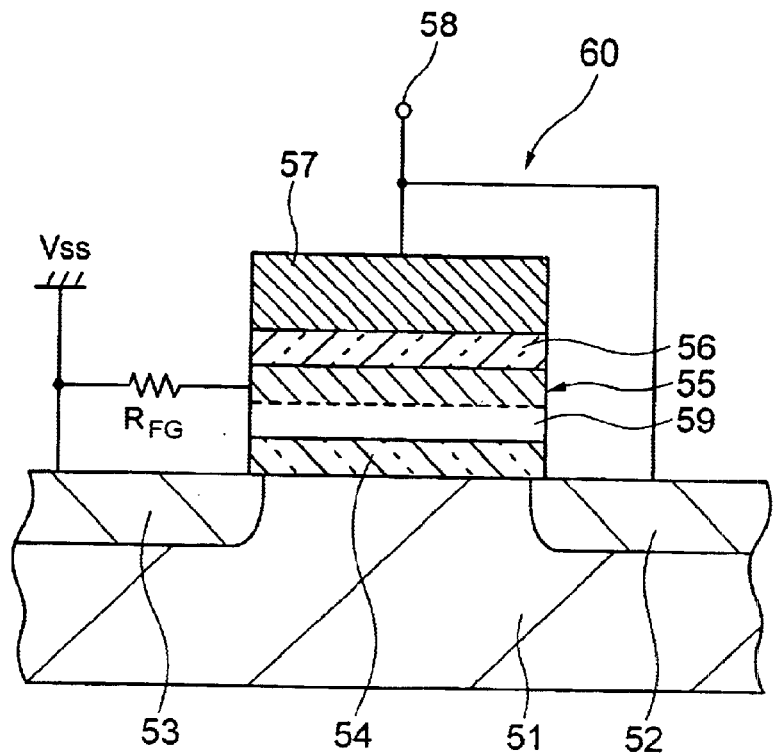
FIG. 12A is a schematic sectional view of an ESD protective circuit according to a fifth embodiment of the present invention.

Referring to FIG. 12A, a protective circuit according to a fifth embodiment of the present invention includes a floating gate nMOSFET 60.

The nMOSFET 60 of FIG. 12A includes a drain diffused region 52 and a source diffused region 53 both having an n-conductivity type and formed on the surface area of the p-type silicon substrate 51. A tunnel oxide film 54, a floating gate electrode 55, an inter-electrode insulation film 56, and a control gate electrode 57 are consecutively formed on the space of the silicon substrate 51 between the drain diffused region 52 and the source diffused region 53. The tunnel oxide film 54 is made of silicon oxide having a thickness of around 10 nm, whereas the inter-electrode insulation film 56 has a three-layer structure including silicon oxide, silicon nitride and silicon oxide films (ONO structure). The inter-electrode insulation film has a thickness of around 20 nm in terms of the silicon oxide thickness.

The floating gate electrode 55 is made of polysilicon doped with n-type impurities such as phosphorus or arsenic at a concentration of $10^{18}$ to $10^{19}$ atoms/cm$^3$. The control gate electrode 57 is made of a silicide.

The drain diffused region 52 and the control gate electrode 67 are connected together to an I/O terminal 58. The source diffused region 53 is connected to the ground line VSS, and the floating gate electrode 55 is connected to the ground line VSS via a floating gate resistor $R_{FG}$. In this configuration upon input of an excessively high voltage, a depletion layer 59 is formed in the floating gate electrode 55, as shown in FIG. 12A.

Figure 12B:
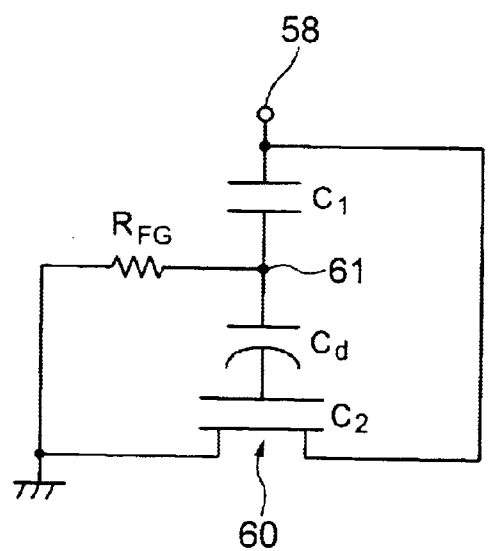
FIG. 12B is an equivalent circuit diagram of the ESD protective circuit of FIG. 12A.

FIG. 12B shows an equivalent circuit diagram of the floating gate nMOSFET of FIG. 12A upon input of the excessively high voltage. In the nMOSFET 60, a first capacitor C1 formed between the control electrode 57 and the floating gate electrode 55, a second capacitor Cd corresponding to the depletion layer 59 and a third capacitor C2 formed between the floating gate electrode 55 and the silicon substrate 51 are connected in series. The floating gate electrode 5 has therein a node 61 connected to the ground line VSS via the floating gate resistor $R_{FG}$.

Figure 13A:
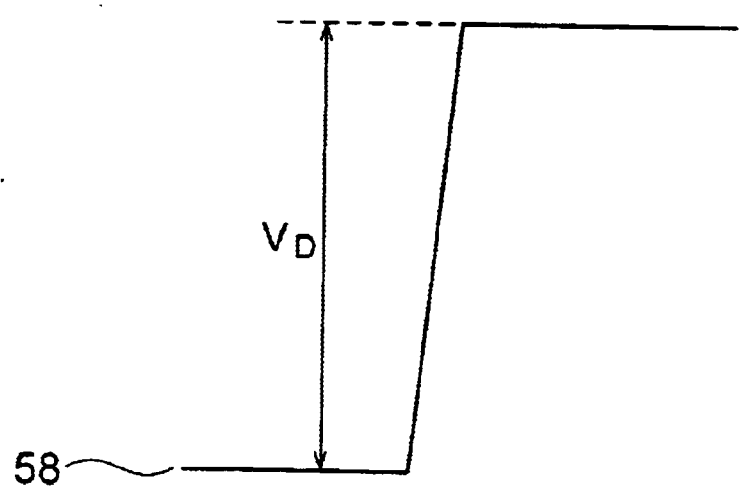
FIGS. 13A and 13B are graphs showing the voltage profile in the fifth embodiment.
Figure 13B:
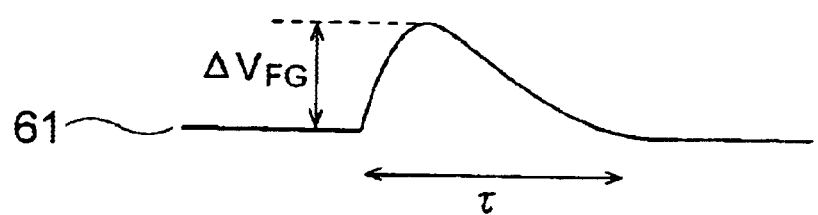

If an excessively high step voltage having a step amplitude of $V_D$, such as shown in FIG. 13A, is applied to the I/O terminal 58, a voltage pulse is generated on the node 61 of the floating gate 55, the voltage pulse having a pulse amplitude of $\Delta V_{FG}$ and a pulse width of τ, as shown in FIG. 13B. The voltage pulse allows the floating gate MOSFET 60 to momentarily operate in a pinch-off mode similarly to the above embodiments.

In a simulation with the floating gate resistor $R_{FG}$, first capacitor C1, third capacitor C3 and the impurity concentration in the floating gate being parameters, it was confirmed that the depletion layer 59, if it was formed, caused a non-linear relationship between the pulse amplitude $\Delta V_{FC}$ and the step amplitude $V_D$, wherein an increase of $V_D$ abruptly increased $\Delta V_{FG}$ in a specific range.

Figure 14:
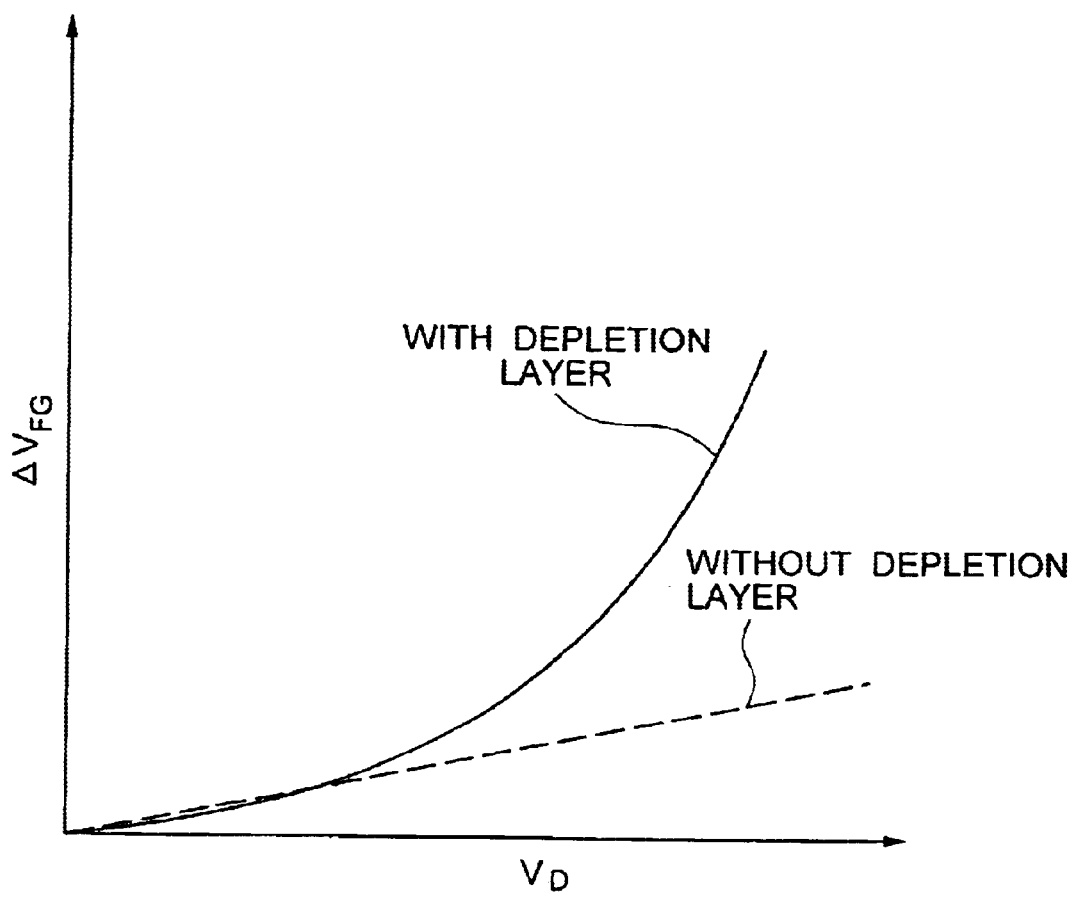
FIG. 14 is a graph showing the effect of the fifth embodiment.

FIG. 14 shows the relationship between the step amplitude $V_D$ and the pulse amplitude $\Delta V_{FG}$ obtained by the simulation. As understood from FIG. 14, if any depletion layer is not formed in the floating gate 55, the pulse amplitude $\Delta V_{FG}$ increases in proportion to an increase of the step amplitude $V_D$, wherein:

$$\Delta V_{FG}=a \times C1/(C1+C2)VD.$$

In contrast, if a depletion layer 59 is formed in the floating gate 55, although the relationship $\Delta V_{FG}=a\ V_D \times C1/(C1+C2)$ wherein "a" is a constant holds in the range of small value for $V_D$, $\Delta V_{FG}$ abruptly increase with an increase of $V_D$. This is because the capacitance Cd of the depletion layer depends on $\Delta V_{FG}$ and reduces with an increase of $\Delta V_{FG}$, which further increases $\Delta V_{FG}$ corresponding to the decrease of Cd. In other word, the increase of $\Delta V_{FG}$ is associated with a positive feedback.

As described above, a higher amplitude of the excessively high input voltage increases the ESD capability of the floating gate MOSFET 60 in the fifth embodiment. By using this principle, a configuration is employed wherein the floating gate MOSFET 60 does not operate as the protective element upon input of a normal signal, such as clock signal, to the semiconductor device. This is because it is possible to design the above floating gate MOSFET 60 to operate in a pinch-off mode only when an input step voltage has a higher step amplitude than the clock signal voltage.

It is preferable to completely nullify the momentary operation of the floating gate MOSFET 60 upon input of the clock signal, for example, for reducing the power dissipation of the semiconductor device. The nullification may be achieved by some configurations. For example, a diode and a resistor are connected serially between the I/O line and the ground line, with the anode side of the diode being directed to the I/O line. The control gate of the floating gate MOSFET is connected to the node connecting the diode and the resistor. The diode has a reverse breakdown voltage designed to have a specific value, whereby the control gate is applied with an operational voltage only when an excessively high input voltage is applied. Another technique is such that the protective circuit includes a voltage detector connected to the control gate.

Back to FIG. 12A, the floating gate nMOSFET 60 may be replaced by a floating gate pMOSFET. In this case, the polysilicon layer of the floating gate electrode 55 is doped with p-type impurities such as boron. In addition, the conductivity types are reversed from those described.

In the above embodiments, the entire are of the control gate electrode opposes the floating gate electrode. However, a portion of the control gate electrode may oppose a portion or entire surface of the floating gate in the present invention, and vice versa. In this case, the capacitance C1 between the control gate and the floating gate may be lower to reduce the pulse amplitude $\Delta V_{FG}$.

It is preferable that the control gate electrode be made of a polysilicon layer such as a polycide layer. In this case, a depletion layer is formed in the polysilicon layer upon input of an excessively high voltage. The depletion layer suppresses the breakdown of the inter-electrode insulation film. In addition, a smaller apparent capacitance C1 between the control gate electrode and the floating gate electrode reduces the pulse amplitude $\Delta V_{FG}$. The polysilicon layer may be doped with n-type or p-type impurities.

In the present invention, a plurality of MOSFETs may be connected in series or in parallel in the protective circuit.

As described above, the principle of the present invention is such that an excessively high input voltage momentarily raises the potential of the floating gate of the floagating gate MOSFET to operate the MOSFET in a pinch-off mode and generate positive holes. The positive holes thus generated triggers the floating gate MOSFET to stare uniformly and operate the ESD. The present invention includes other configurations that cause such an operation.

Now, the present invention is more specifically described with reference to accompanying drawings, wherein similar constituent elements are designated by similar reference numerals.

What is claimed is:

1. A semiconductor device comprising:

a semiconductor substrate;

an internal circuit formed on said semiconductor substrate; and a protective circuit for protecting said internal circuit against an electrostatic discharge breakdown, wherein said protective circuit includes at least one first floating gate MOSFET, said first floating gate MOSFET having a source-drain path connected between an I/O line and a constant potential line, a control gate connected to said I/O line, a floating gate connected to said constant potential line or a first line, wherein said floating gate is connected to said constant potential line via a floating gate resistor.

2. A semiconductor device comprising:

a semiconductor substrate;

an internal circuit formed on said semiconductor substrate; and a protective circuit for protecting said internal circuit against an electrostatic discharge breakdown, wherein said protective circuit includes at least one first floating gate MOSFET, said first floating gate MOSFET having a source-drain path connected between an I/O line and a constant potential line, a control gate connected to said I/O line, a floating gate connected to said constant potential line or a first line, wherein said first floating gate MOSFET has a backgate connected to said constant potential line via a backgate resistor.

3. A semiconductor device comprising:

a semiconductor substrate;

an internal circuit formed on said semiconductor substrate; and a protective circuit for protecting said internal circuit against an electrostatic discharge breakdown, wherein said protective circuit includes at least one first floating gate MOSFET, said first floating gate MOSFET having a source-drain path connected between an I/O line and a constant potential line, a control gate connected to said I/O line, a floating gate connected to said constant potential line or a first line, wherein said first floating gate MOSFET is a pMOSFET and said constant potential line is a high-voltage power source line.

4. A semiconductor device comprising:

a semiconductor substrate;

an internal circuit formed on said semiconductor substrate; and a protective circuit for protecting said internal circuit against an electrostatic discharge breakdown, wherein said protective circuit includes at least one first floating gate MOSFET, said first floating gate MOSFET having a source-drain path connected between an I/O line and a constant potential line, a control gate connected to said I/O line, a floating gate connected to said constant potential line or a first line, wherein said protective circuit includes at least one second floating gate MOSFET, said second floating gate MOSFET having a source-drain path connected between said I/O line and another constant potential line, a control gate connected to said I/O line, a floating gate connected to said another constant potential line via a floating gate resistor.

5. A semiconductor device comprising:

a semiconductor substrate;

an internal circuit formed on said semiconductor substrate; and a protective circuit for protecting said internal circuit against an electrostatic discharge breakdown, wherein said protective circuit includes at least one first floating gate MOSFET, said first floating gate MOSFET having a source-drain path connected between an I/O line and a constant potential line, a control gate connected to said I/O line, a floating gate connected to said constant potential line or a first line, wherein said protective circuit further includes at least one second floating gate MOSFET, said second floating gate MOSFET having a source-drain path connected between said I/O line and another constant potential line, a control gate connected to said I/O line, a floating gate connected to said first line which is connected to said internal circuit.

6. A semiconductor device comprising:

a semiconductor substrate;

an internal circuit formed on said semiconductor substrate; and a protective circuit for protecting said internal circuit against an electrostatic discharge breakdown, wherein said protective circuit includes at least one first floating gate MOSFET, said first floating gate MOSFET having a source-drain path connected between an I/O line and a constant potential line, a control gate connected to said I/O line, a floating gate connected to said constant potential line or a first line, wherein said at least one first floating gate MOSFET includes a plurality of floating gate MOSFETs of the same conductivity type connected in parallel.

7. The semiconductor device according to claim 6, wherein said first floating gate MOSFET has a plurality of fingers for each of said control gate and said floating gate.

8. The semiconductor device according to claim 2, wherein said source-drain path is formed in a well.

9. The semiconductor device according to claim 8, wherein said backgate resistor has a resistance defined by a distance between a bottom of an isolation film and bottom of said well.

10. A semiconductor device comprising:

a semiconductor substrate;

an internal circuit formed on said semiconductor substrate; and a protective circuit for protecting said internal circuit against an electrostatic discharge breakdown, wherein said protective circuit includes at least one first floating gate MOSFET, said first floating gate MOSFET having a source-drain path connected between an I/O line and a constant potential line, a control gate connected to said I/O line, a floating gate connected to said constant potential line or a first line, wherein said floating gate is made of a polysilicon doped with impurities, and wherein a depletion layer is formed in said floating gate and/or said control gate upon input of an excessively high voltage.

11. The semiconductor device according to claim 10, wherein said floating gate has an impurity concentration of $10^{18}$ to $10^{19}$ atoms/cm$^3$.

12. A semiconductor device comprising:

a semiconductor substrate;

an internal circuit formed on said semiconductor substrate; and a protective circuit for protecting said internal circuit against an electrostatic discharge breakdown, wherein said protective circuit includes at least one first floating gate MOSFET, said first floating gate MOSFET having a source-drain path connected between an I/O line and a constant potential line, a control gate connected to said I/O line, a floating gate connected to said constant potential line or a first line, wherein said at least one floating gate MOSFET includes a plurality of MOSFETs of the same conductivity type connected in series.

13. A semiconductor device comprising a semiconductor substrate, an internal circuit formed on said semiconductor substrate, and a protective circuit for protecting said internal circuit against an electrostatic discharge breakdown, said protective circuit including at least one first floating gate MOSFET, said first floating gate MOSFET having a source-drain path connected between a first I/O line and second I/O line, a control gate connected to said first I/O line, a floating gate connected to a ground line.

14. The semiconductor device according to claim 13, wherein said protective circuit further includes at least one second floating gate MOSFET having a conductivity type same as a conductivity type of said first floating gate MOSFET, said second floating gate MOSFET having a source-drain path connected between said first I/O line and said second I/O line, a control gate connected to said second I/O line, a floating gate connected to said ground line.

15. A semiconductor device according to claim 1, wherein said first floating gate MOSFET is an nMOSFET and said constant potential line is a ground line.

16. A semiconductor device according to claim 1, wherein said control gate is a silicide layer.

17. A semiconductor device according to claim 1, wherein said control gate includes polysilicon.

18. A semiconductor device according to claim 1, wherein said control gate and said floating gate partially overlap each other as viewed from above.

19. A semiconductor device according to claim 1, wherein said floating gate is made of a polysilicon doped with impurities.

* * * * *